United States Patent
Kwak et al.

(10) Patent No.: US 7,474,375 B2
(45) Date of Patent: Jan. 6, 2009

(54) FLAT DISPLAY DEVICE HAVING A COVERING FILM AND INTERCONNECTION LINE INSIDE A PATTERNED PORTION COMPLETELY COVERED BY ONLY ONE SEALANT

(75) Inventors: Won-Kyu Kwak, Seongnam-si (KR); Kwan-Hee Lee, Seoul (KR); Tae-Wook Kang, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 356 days.

(21) Appl. No.: 11/072,367

(22) Filed: Mar. 7, 2005

(65) Prior Publication Data

US 2005/0195355 A1 Sep. 8, 2005

(30) Foreign Application Priority Data

Mar. 8, 2004 (KR) ............... 10-2004-0015598

(51) Int. Cl.
G02F 1/1339 (2006.01)

(52) U.S. Cl. ............................ 349/153; 349/149
(58) Field of Classification Search ............ 349/149, 349/153
See application file for complete search history.

(56) References Cited

U.S. PATENT DOCUMENTS

| 5,882,761 | A |   | 3/1999  | Kawami et al. ............ 428/69 |
| 6,011,608 | A | * | 1/2000  | Tanaka ...................... 349/153 |
| 6,359,606 | B1 |  | 3/2002  | Yudasaka .................... 345/87 |
| 6,590,337 | B1 |  | 7/2003  | Nishikawa et al. .......... 313/509 |
| 6,970,225 | B2 | * | 11/2005 | Tanaka et al. ............... 349/153 |
| 2002/0011975 | A1 | * | 1/2002 | Yamazaki et al. ............ 345/76 |
| 2002/0163614 | A1 | * | 11/2002 | Hinata et al. ............... 349/139 |

FOREIGN PATENT DOCUMENTS

| CN | 1338712 A | 3/2002 |
| CN | 1381749 A | 11/2002 |
| CN | 1381751 A | 11/2002 |
| JP | 2000-173779 | 6/2000 |
| JP | 2002-110343 | 4/2002 |
| JP | 2003-015547 | 1/2003 |
| JP | 2003036040 | 2/2003 |
| JP | 2003-228302 | 8/2003 |
| JP | 2003-332070 | 11/2003 |
| JP | 2003-347044 | 12/2003 |
| JP | 2004-055529 | 2/2004 |
| KR | 10-2002-0009498 A | 2/2002 |
| WO | 03-060858 | 7/2003 |

OTHER PUBLICATIONS

Machine Translation of KIPO Notice of Submission of Opinion No. 95-2006-003986479.*

* cited by examiner

*Primary Examiner*—David C. Nelms
*Assistant Examiner*—John Heyman
(74) *Attorney, Agent, or Firm*—H.C. Park & Associates, PLC

(57) ABSTRACT

A flat display device including a display region, for displaying an image, between a first substrate and a second substrate. The flat display device includes a sealant adhering the first substrate to the second substrate, one or more interconnection lines between the sealant and the first substrate, and a covering film between the sealant and the interconnection lines.

18 Claims, 5 Drawing Sheets

FLAT DISPLAY DEVICE HAVING A COVERING FILM AND INTERCONNECTION LINE INSIDE A PATTERNED PORTION COMPLETELY COVERED BY ONLY ONE SEALANT

CROSS REFERENCE TO RELATED APPLICATION

This application claims priority to and the benefit of Korean Patent Application No. 10-2004-0015598, filed on Mar. 8, 2004, which is hereby incorporated by reference for all purposes as if fully set forth herein.

BACKGROUND OF THE INVENTION

1. Field of the Invention

The present invention relates to a flat display device, and more particularly, to a flat display device with a larger display area and greater resistance to deterioration by moisture.

2. Discussion of the Background

Flat display devices, such as liquid crystal displays (LCDs) and organic or inorganic electro-luminescent (EL) displays, may be categorized as passive matrix (PM) or active matrix (AM) type depending on how they are driven. In a PM display, a plurality of anodes and cathodes may be arranged in columns and rows, respectively, and a row driving circuit transmits a scan signal to a cathode selected from a row. Also, a column driving circuit may input a data signal into each anode.

An AM display is widely used for displaying moving pictures since it processes a great number of signals by using a thin film transistor (TFT) to control the signal input to each pixel.

An organic EL display has an organic luminescent film between an anode and a cathode. Applying an anode voltage and a cathode voltage to the anode and the cathode, respectively, transports holes, introduced from the anode, to the luminescent film via a hole transport layer (HTL), and electrons, introduced from the cathode, to the luminescent film via an electron transport layer (ETL). The electrons and the holes combine in the luminescent film to produce excitons. As the excitons change from an excited to ground state, fluorescent molecules on the luminescent film emit light to form an image. Red (R), green (G), and blue (B) pixels may be utilized in a full-color organic EL display.

However, in the organic EL displays, organic films are susceptible to moisture. Thus, various techniques of sealing the display region with a substrate or metal cap have been proposed to protect the organic luminescent film from moisture and to protect the display region from physical shock.

FIG. 1A is a plan view of a conventional AM type organic EL display, and FIG. 1B is a cross-sectional view taken along line I-I of FIG. 1A.

Referring to FIG. 1A and FIG. 1B, the AM type organic EL display includes a display region 20 located on a transparent insulating substrate 10. The display region 20, which includes an organic light emitting device (OLED), is hermetically sealed by bonding a metal cap 90 to the transparent insulating substrate 10 using a sealant 81. The OLED includes a TFT and a plurality of pixels. A cathode 40, which is one electrode of the OLED, is located on the display region 20 and connected to an external terminal region 70 via an electrode power supply line 41. A plurality of driving lines 31 is installed in the display region 20 and connected to the terminal region 70 via a driving power supply line 30, which is located outside the display region 20. A vertical circuit portion 50 and a horizontal circuit portion 60 are located outside the display region 20 and connected to the terminal region 70 via circuit lines 51 and 61, respectively. The vertical and horizontal circuit portions 50 and 60 transmit signals to the TFT of the display region 20.

In this AM type organic EL display, the metal cap 90 covers the display region 20, the circuit lines 51 and 61, and the vertical and horizontal circuit portions 50 and 60. In other words, the metal cap 90 covers the entire region except the terminal region 70. Accordingly, the sealed portion includes not only the display region 20, but also the circuit lines 51 and 61 and the s circuit portions 50 and 60, which do not actually display images. This structure decreases the size of the display region 20 relative to the entire display device, thereby providing a larger non-radiative region, or dead space.

For this reason, with the organic EL display shown in FIG. 1A and FIG. 1B, the circuit lines 51 and 61 that connect the display region 20 and the terminal region 70 must be thinned, increasing their resistance.

Hence, for the reasons noted above, an organic EL device having a larger display region that is adequately protected from moisture is desired.

SUMMARY OF THE INVENTION

The present invention provides a flat display device with a larger display region relative to the entire display device, and a smaller non-radiative region.

The present invention also provides a flat display device that may have improved resistance to moisture and corrosion of a sealant.

Additional features of the invention will be set forth in the description which follows, and in part will be apparent from the description, or may be learned by practice of the invention.

The present invention discloses a flat display device including a display region for displaying an image, between a first substrate and a second substrate. The device includes a sealant adhering the first substrate to the second substrate, one or more interconnection lines between the sealant and at least one substrate, and a covering film between the sealant and the interconnection lines.

The present invention also discloses a flat display device, between a first substrate and a second substrate, including a sealant adhering the first substrate to the second substrate, one or more interconnection lines between the sealant and the first substrate, and a display region comprising a selection driving circuit coupled to a pixel, at least one insulating film covering the selection driving circuit, and a pixel electrode located on the insulating film. The device further comprises a covering film between the sealant and the interconnection lines to cover the interconnection lines, and the covering film is formed of a same material as the pixel electrode.

The present invention also discloses a flat display device including a display region for displaying an image, between a first substrate and a second substrate, the device comprising a sealant adhering the first substrate to the second substrate, an interconnection line between the sealant and the first substrate and a covering film between the sealant and the interconnection line. The interconnection line extends along the sealant.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Hereinafter, exemplary embodiments of the present invention will be described with reference to the attached drawings.

Figure 1A:
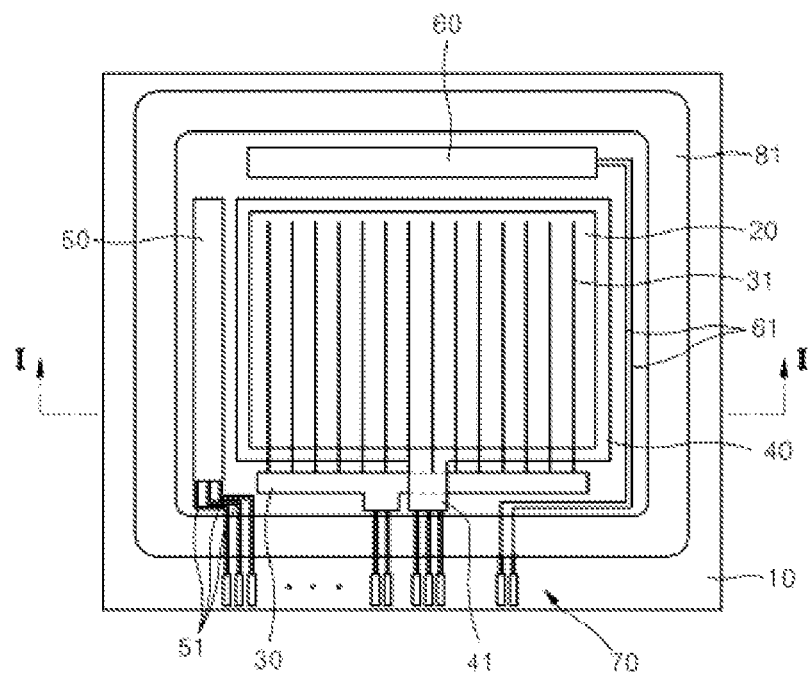
FIG. 1A is a plan view of a conventional flat display device.
Figure 1B:
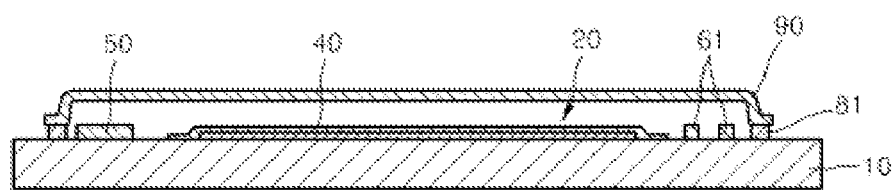
FIG. 1B is a cross-sectional view taken along line I-I of FIG. 1A.
Figure 2A:
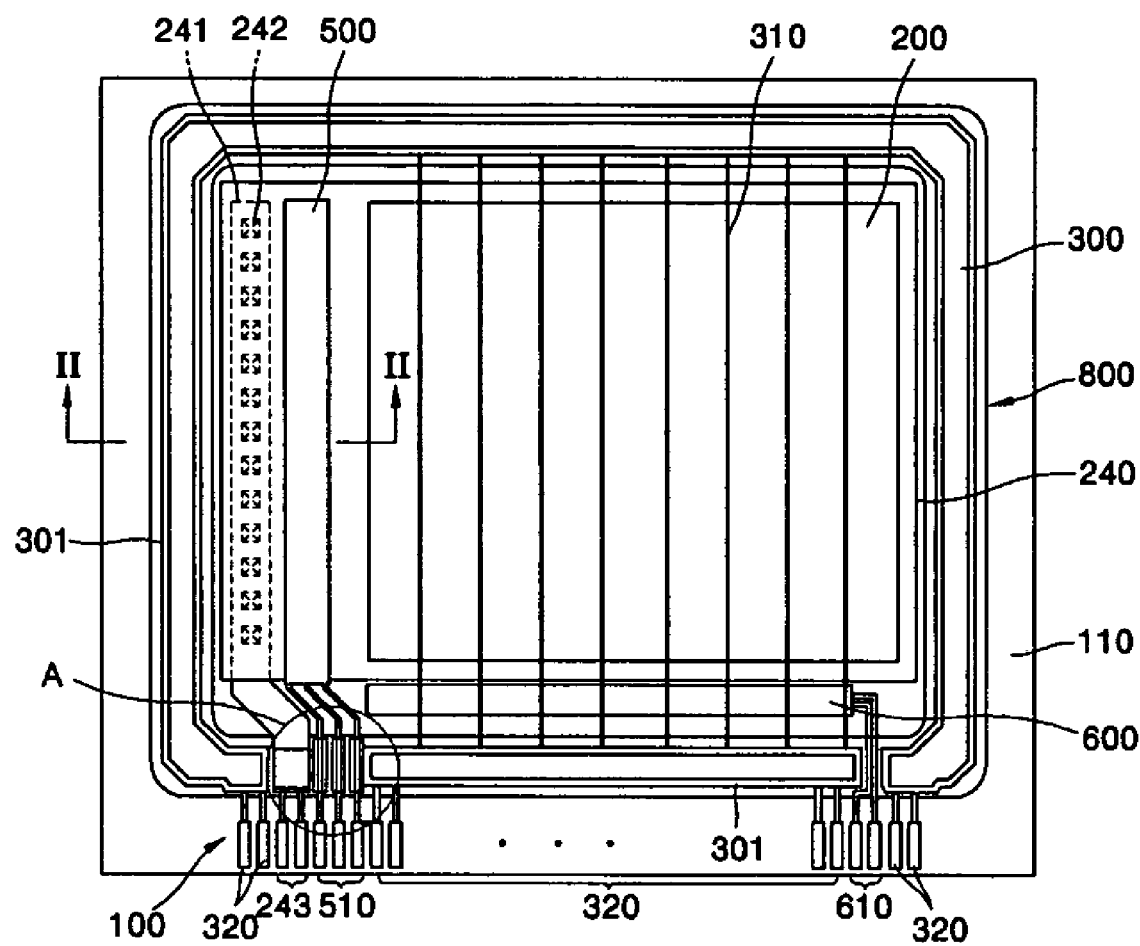
FIG. 2A is a plan view of a flat display device according to an exemplary embodiment of the present invention.
Figure 2B:
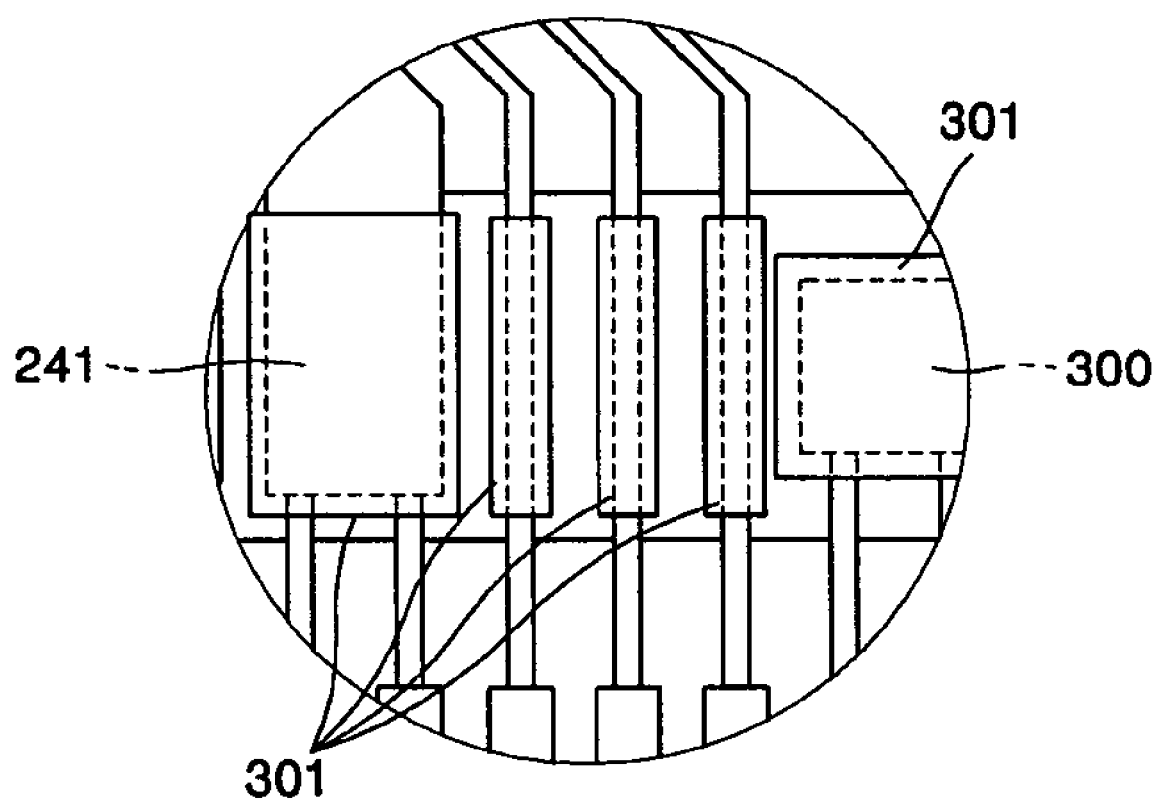
FIG. 2B is an exploded view of portion A of FIG. 2A.
Figure 2C:
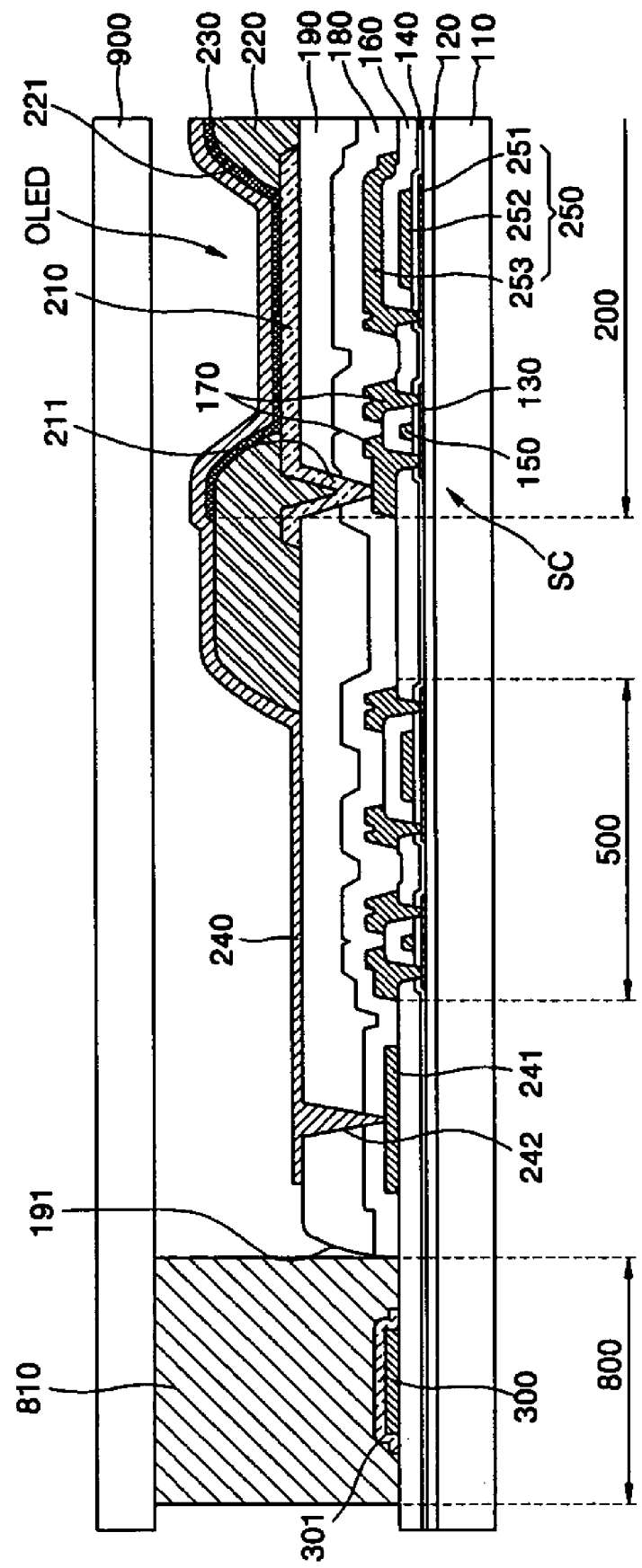
FIG. 2C is a cross-sectional view taken along line II-II of FIG. 2A.

FIG. 2A is a plan view of an organic EL display device according to an exemplary embodiment of the present invention, and FIG. 2C is a cross-sectional view taken along line II-II of FIG. 2A.

Referring to FIG. 2A, a display region 200, a sealing portion 800, and a terminal region 100 are located on a surface of a first substrate 110. An emission device, such as an OLED, is located in the display region 200. The sealing portion 800 bonds the first substrate 110 and a second substrate 900. A variety of terminals are located in the terminal region 100.

The OLED will be described with reference to FIG. 2C, which is a cross-sectional view taken along line II-II of FIG. 2A.

Referring to FIG. 2C, a buffer film 120 may be formed using $SiO_2$ on the first substrate 110, which may be glass or plastic. Selection driving circuits SC are provided for respective pixels on the buffer film 120, and an insulating film, which may include a passivation film 180 and a planarization film 190, covers the selection driving circuit SC. Each pixel may comprise an OLED on the insulating film.

Each selection driving circuit SC may include two or more thin film transistors (hereinafter, referred to as TFTs) and one or more capacitors.

The structure of a TFT will now be described.

In the TFT, a semiconductor active film 130 is located on the buffer film 120, and a gate insulating film 140 covers the semiconductor active film 130. A gate electrode 150 is located on the gate insulating film 140, and an inter-insulator 160 covers the gate electrode 150. Source/drain electrodes 170 are located on the inter-insulator 160. The source/drain electrodes 170 are coupled to source/drain regions (not shown), respectively, of the semiconductor active film 130 through contact holes formed in the gate insulating film 140 and the inter-insulator 160.

The active film 130 may be formed of an inorganic or organic semiconductor, and it includes the source/drain regions and a channel region (not shown) coupling the source/drain regions to each other. A lightly doped drain (LDD) may be also be formed between the source/drain and channel regions to cut off leakage current.

The active film 130 may be formed of an inorganic semiconductor such as CdS, GaS, ZnS, CdSe, CaSe, ZnSe, CdTe, SiC, and Si.

The active film 130, formed of an organic semiconductor, may include polymer materials or monomer materials. The polymer materials may be any of the following or their derivatives: polythiophene, polyparaphenylenvinylene, polyparaphenylen, polyflorene, polythiophenevinylene, and polythiophene-heterocyclic aromatic copolymer. The monomer materials may be any of the following or their derivatives: pentacene, tetracene, or oligoacene of naphthalene, alpha-6-thiophene, oligothiophene of alpha-5-thiophene, metal-containing or metal-free phthalocyanin, pyromelitic dianhydride, pyromelitic diimide, perylenetetracarboxylic acid dianhydride, and perylenetetracarboxylic diimide.

The gate insulating film 140 may be formed of $SiO_2$, $SiN_x$, or a double film of $SiO_2$ and $SiN_x$. The gate insulating film 140 may also be formed of organic materials.

The gate electrode 150, which is formed on a predetermined region of the gate insulating film 140, may be formed of a conductive metal, such as MoW, Al, Cr, Al/Cu, and Ti/Al/Ti. The gate electrode 150 may also be formed of various conductive materials, such as a conductive polymer.

The inter-insulator 160, which is formed on the gate electrode 150, may be formed of $SiO_2$, $SiN_x$, or organic materials. The source/drain electrodes 170 may be formed of the same material as the gate electrode 150.

The passivation film 180, which may be formed on the source/drain electrodes 170, may be formed of $SiO_2$, $SiN_x$, or organic materials. The planarization film 190 may be formed on the passivation film 180 and be made of acryl, polyimide, or benzocyclobutene (BCB). Alternative structures include forming the planarization film 190 directly on the source/drain electrodes 170. Additionally, the TFT's structure may vary according to design specifications.

In addition to the TFT, each pixel may include a capacitor 250, which may have various shapes. Here, the capacitor 250 includes a first film 251, which may be formed of the same material as the active film 130, a second film 252, which may be formed of the same material as the gate electrode 150, and a third film 253, which may be formed of the same material as the source/drain electrodes 170.

A first electrode 210 may be formed on a surface of the planarization film 190 as an OLED pixel electrode. A via hole 211, which may be formed in the passivation film 180 and the planarization film 190, couples the first electrode 210 to one of the source/drain electrodes 170.

A pixel defining film 220 may be formed of an organic material to cover the first electrode 210, and an opening 221 may then be formed to expose a portion of the first electrode 210. An organic film 230, having an emission layer, may be formed in the opening 221.

The OLED may emit red, green, or blue light, according to the organic film 230 and current flow, to display part of an image. The OLED includes the first electrode 210, which may be coupled to a drain electrode of the TFT to receive positive power from the TFT, a second electrode 240, which is an opposing electrode covering all pixels and providing negative power, and the organic film 230, which is formed between the first electrode 210 and the second electrode 240 to emit light.

The first electrode 210 and the second electrode 240 are electrically insulated from each other by the organic film 230, and they apply different polarities of voltage to the organic film 230, thus enabling it to emit light.

The organic film 230 may be a monomer or polymer organic film. A monomer organic film may be formed by stacking a hole injection layer (HIL), a hole transport layer (HTL), an emission layer (EML), an electron transport layer (ETL), and an electron injection layer (EIL) in a simple or complex structure. Various organic materials may be used, including copper phthalocyanine (CuPc), N,N'-Di(naphthalene-1-yl)-N,N'-diphenyl-benzidine (NPB), and tris-8-hydroxyquinoline aluminum (Alq3). These monomer organic films may be formed by vacuum deposition.

A polymer organic film may include an HTL and an EML. Here, the HTL may be formed of PEDOT, and the EML may be formed of a polymer organic material, such as poly-phenylenevinylene (PPV)-containing material or polyfluorene-containing material, by screen printing, inkjet printing, or other like methods.

Various other structures may be used for the organic film 230.

The first electrode 210 may serve as an anode, while the second electrode 240 serves as a cathode. Alternatively, the first electrode 210 may serve as a cathode, and the second electrode 240 may serve as an anode. Also, the first electrode 210 may be patterned corresponding to each pixel region, and the second electrode 240 may be patterned to cover all pixels.

The first electrode 210 may be a transparent or reflective electrode. If formed as a transparent electrode, it may be formed of ITO, IZO, ZnO, or In$_2$O$_3$. If formed as a reflective electrode, it may include a reflective film of Ag, Mg, Al, Pt, Pd, Au, Ni, Nd, Ir, Cr, or a combination thereof, and a transparent electrode film of ITO, IZO, ZnO, or In$_2$O$_3$.

Similarly, the second electrode 240 may be a transparent electrode or a reflective electrode. If formed as the transparent electrode, when used as a cathode, it may include a metal film, having a small work function, such as Li, Ca, Lif/Ca, Lif/Al, Al, Ag, Mg, or a combination thereof, deposited to face the organic film 230, and an auxiliary electrode film or a bus electrode line, formed of ITO, IZO, ZnO, or In$_2$O$_3$. If formed as the reflective electrode, it may be formed by depositing Li, Ca, Lif/Ca, Lif/Al, Al, Ag, Mg, or a combination thereof.

The display region 200 shown in FIG. 2A comprises pixels, each of which may include an OLED as described above. An image may be displayed by the display region 200.

As shown in FIG. 2C, the sealing portion 800 bonds the second substrate 900 to the first substrate 110 to protect the display region 200 from external shock, moisture, and air.

An insulating glass substrate may be used as the second substrate 900, but a metal cap or other sealing members may alternatively be used.

The sealing portion 800 may be formed of a sealant 810, which may be a UV-curing sealant or a thermal curing sealant.

As shown in FIG. 2A, a terminal region 100, where terminals are installed, is located at a terminal portion of the first substrate 110. The terminal region 100 may be exposed outside the sealing portion 800.

A driving power supply line 300, an electrode power supply line 241, and various drivers 500 and 600 may be installed adjacent to the display region 200. The driving power supply line 300 supplies a driving voltage to VDD lines 310 of the display region 200. The electrode power supply line 241, coupled to the second electrode 240, supplies cathode power to the second electrode 240. The drivers 500 and 600 control signals applied to the display region 200.

The driving power supply line 300 is coupled to driving power terminals 320 of the terminal region 100 and the VDD lines 310, and it surrounds the display region 200.

The second electrode 240 receives power from the electrode power supply line 241, which is outside the display region 200, as shown in FIG. 2A and FIG. 2C. The electrode power supply line 241 may be formed on the inter-insulator 160, and it may be formed using the same material as the source/drain electrodes 170.

The electrode power supply line 241 may be covered by the passivation film 180 and the planarization film 190, and a via hole 242 couples it to a terminal of the second electrode 240. The electrode power supply line 241 is also coupled to electrode power supply terminals 243 of the terminal region 100.

The structure of the electrode power supply line 241 may change. For example, it may be formed on the planarization film 190 using a material that forms the first electrode 210, the pixel defining film 220 may cover it, and a via hole may be formed in the pixel defining film 220 to couple it to the second electrode 240.

Referring to FIG. 2A, the vertical driver 500 may be located on a side of the display region 200, and the horizontal driver 600 may be located below the display region 200. However, other layouts may be utilized. The drivers 500 and 600 are coupled to driver terminals 510 and 610, respectively.

As shown in FIG. 2A, the drivers 500 and 600 may be positioned inside the sealing portion 800, or they may be embodied by external integrated circuits (ICs) or chips on glass (COGs).

In an exemplary embodiment of the present invention, as shown in FIG. 2A and FIG. 2C, at least a portion of the driving power supply line 300 may be located between the first substrate 110 and the sealant 810. The driving power supply line 300 may be installed along the sealing portion 800 between the sealant 810 and the first substrate 110. Accordingly, the display region 200 may be enlarged to occupy the area within the driving power supply line 300.

As FIG. 2C shows, the driving power supply line 300 may be almost as wide as the sealant 810 of the sealing portion 800. Increasing the width reduces the resistance of the driving power supply line 300, thereby preventing voltage drop.

The driving power supply line 300 may be a conductive metal, and it may be formed of the same material as the source/drain electrodes 170.

As can be seen from FIG. 2B, which is an exploded view of portion A of FIG. 2A, a covering film 301 may cover the driving power supply line 300. The covering film 301 may be formed of the same material as the first electrode 210.

Accordingly, if the first electrode 210 is a transparent electrode, the covering film 301 may be formed of ITO, IZO, ZnO, or In$_2$O$_3$. If the first electrode 210 is a reflective electrode, the covering film 301 may be a double layer including a reflective film and a transparent electrode film. The reflective film may be formed of Ag, Mg, Al, Pt, Pd, Au, Ni, Nd, Ir, Cr, or a combination thereof, and the transparent electrode film may be formed on the reflective film and formed of ITO, IZO, ZnO, or In$_2$O$_3$. Alternatively, when the first electrode 210 is a reflective electrode, the covering film 301 may have only one of the reflective film and the transparent electrode film.

The covering film 301 prevents the driving power supply line 300 from contacting the sealant 810, which prevents their corrosion by chemical reaction.

Additionally, the covering film 301 protects the driving power supply line 300 while the first electrode 210 is being patterned, particularly when the covering film 301 is formed of the same material as the first electrode 210.

Since the covering film 301 is conductive, the IR drop in the driving power supply line 300 is reduced further.

As FIG. 2C shows, the driving power supply line 300 may be formed over the first substrate 110. Specifically, the driving power supply line 300 is positioned inside an entrance portion 191 formed in the buffer film 120, the gate insulating film 140, the inter-insulator 160, the passivation film 180, and the planarization film 190, and the covering film 301 covers the driving power supply line 300. The entrance portion 191 may be formed by patterning the buffer film 120, the gate insulating film 140, the inter-insulator 160, the passivation film 180, and the planarization film 190, or formed using a mask to prevent these films from being formed where the entrance portion 191 will be formed.

By forming the driving power supply line 300 over the first substrate 110, the sealant 810 may contact the first substrate 110, thus enhancing adhesion and preventing moisture or oxygen penetration. Also, when the sealant 810 hardens, the entrance portion 191 functions as a barrier that may prevent the sealant 810 from penetrating the display region 200 or the drivers 500 and 600.

The driving power supply line 300 and the covering film 301 may be formed of various materials. For example, the driving power supply line 300 may be formed of the same material as the first electrode 210, and the covering film 301 may be formed of the same material as the second electrode 240. Alternatively, the driving power supply line 300 may be formed of the same material as the source/drain electrodes 170, and the covering film 301 may be formed of the same material as the second electrode 240. In this case, however, the covering film 301 may be damaged while patterning the first electrode 210, but the other benefits remain.

Additionally, the covering film 301 may also cover various other interconnection lines. For example, as shown in FIG. 2A and FIG. 2B, the covering film 301 may cover the interconnection lines that pass through the sealing portion 800.

Figure 3:
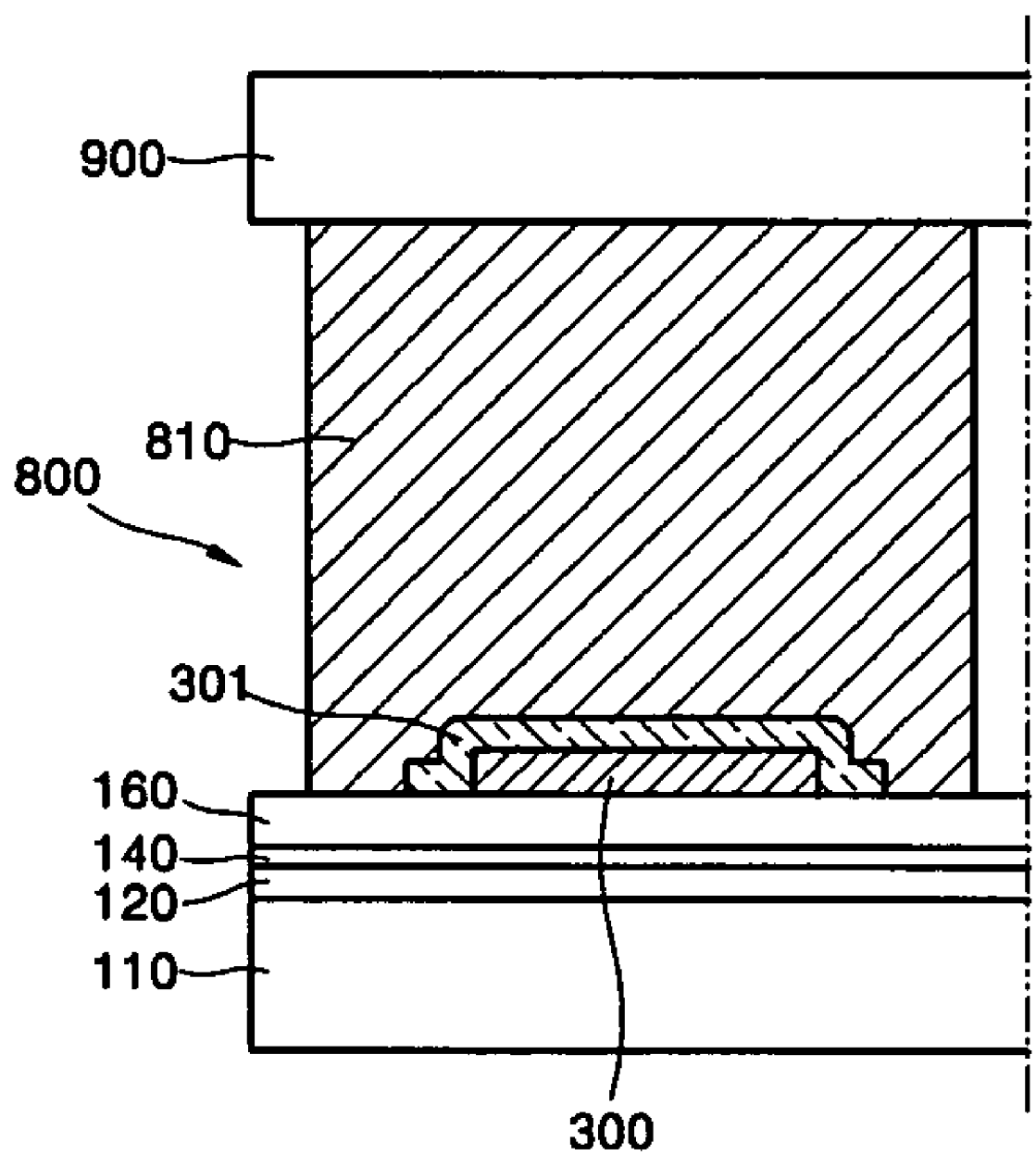
FIG. 3 is a cross-sectional view of a sealing portion of the flat display device shown in FIG. 2A according to an exemplary embodiment of the present invention.

FIG. 3 shows another alternative where the covering film 301 is formed on an insulating film, such as on the inter-insulator 160. In this case, the covering film 301 may be conveniently formed using conventional processes and masks.

Meanwhile, the driving power supply line 300 and the covering film 301 may be formed on the second substrate 900 instead of the first substrate 110.

The driving power supply line 300 and the covering film 301 may also be utilized in a PM type organic EL display.

The present invention is not limited to the above-described exemplary embodiments. The interconnection lines, including the driving power supply line and the electrode power supply line, and the horizontal and vertical drivers may have various configurations according to design specifications. Also, the present invention may be applied to other flat display devices, such as LCDs.

The present invention may have the following advantages.

First, the display panel may be made larger by positioning at least a portion of an interconnection line between the first substrate and the sealant.

Second, covering the interconnection line with the covering film may prevent corrosion between the interconnection line and the sealant.

Third, the interconnection line is protected while patterning the first electrode when the covering film is formed of the same material as the first electrode Fourth, the covering film is formed of a conductive material, which reduces an IR drop in the interconnection line.

Fifth, when the interconnection line and the covering film are formed on the first substrate, the sealant may contact the first substrate, thereby enhancing adhesion between the sealant and the first substrate and preventing the sealant from penetrating the display region before it hardens.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flat display device including a display region for displaying an image, between a first substrate and a second substrate, the device comprising:
   a sealant adhering the first substrate to the second substrate;
   an interconnection line between the sealant and at least one substrate;
   an insulating film including a portion patterned to expose the interconnection line; and
   a covering film between the sealant and the interconnection line,
   wherein the covering film is included inside the patterned portion, the sealant is located inside the patterned portion, the covering film and the interconnection line are completely covered by only one sealant, and the covering film directly contacts the interconnection line.

2. The device of claim 1, wherein the covering film is formed of a conductive material.

3. The device of claim 1, wherein the covering film includes a metal oxide film.

4. The device of claim 3, wherein the metal oxide film is formed of one selected from the group consisting of ITO, IZO, ZnO, and $In_2O_3$.

5. The device of claim 1, wherein the covering film includes a metal film.

6. The device of claim 1,
   wherein the display region includes a self-luminescent element for each pixel;
   wherein a pixel includes a first electrode, a second electrode, and an organic luminescent film between the first electrode and the second electrode; and
   wherein the covering film is formed of a same material as one of the first electrode and the second electrode.

7. The device of claim 1, wherein at least one interconnection line extends along the sealant.

8. The device of claim 1, further comprising:
   a terminal region including a plurality of exposed terminals,
   wherein interconnection lines couple at least a portion of the exposed terminals to the display region.

9. A flat display device between a first substrate and a second substrate, the device comprising:
   a sealant adhering the first substrate to the second substrate;
   an interconnection line between the sealant and the first substrate;
   a display region comprising:
      a selection driving circuit coupled to a pixel;
      at least one insulating film covering the selection driving circuit; and
      a pixel electrode formed on the insulating film, and
   a covering film between the sealant and the interconnection line to cover the interconnection line,
   wherein the covering film is formed of a same material as the pixel electrode, the insulating film includes a portion patterned to expose the interconnection line, the covering film is included inside the patterned portion, the sealant is located inside the patterned portion, the covering film and the interconnection line are completely covered by only one sealant, and the covering film directly contacts the interconnection line.

10. The device of claim 9, wherein the interconnection line is formed of a same material as one electric line of the selection driving circuit.

11. The device of claim 9, wherein the covering film includes a metal oxide film.

12. The device of claim 11, wherein the metal oxide film is formed of one selected from the group consisting of ITO, IZO, ZnO, and $In_2O_3$.

13. The device of claim 9, wherein the covering film includes a metal film.

14. The device of claim 9, wherein at least one interconnection line extends along the sealant.

15. The device of claim 9, further comprising:
a terminal region including a plurality of exposed terminals,
wherein interconnection lines couple at least a portion of the exposed terminals to the display region.

16. A flat display device including a display region for displaying an image, between a first substrate and a second substrate, the device comprising:
a sealant adhering the first substrate to the second substrate;
an interconnection line between the sealant and the first substrate;
an insulating film including a portion patterned to expose the interconnection line; and
a covering film between the sealant and the interconnection line,
wherein the interconnection line extends along the sealant, the covering film is included inside the patterned portion, the sealant is located inside the patterned portion, the covering film and the interconnection line are completely covered by only one sealant, and the covering film directly contacts the interconnection line.

17. The device of claim 16, wherein the covering film is formed of a conductive material.

18. The device of claim 16,
wherein the interconnection line is formed directly on the first substrate; and
wherein the sealant contacts the first substrate.

* * * * *